United States Patent
Slonim et al.

(10) Patent No.: US 7,958,480 B1
(45) Date of Patent: Jun. 7, 2011

(54) PLACEMENT OF I/O BLOCKS WITHIN I/O BANKS USING AN INTEGER LINEAR PROGRAMMING FORMULATION

(75) Inventors: Victor Z. Slonim, Broomfield, CO (US); Parivallal Kannan, Longmont, CO (US); Guenter Stenz, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 331 days.

(21) Appl. No.: 12/106,564

(22) Filed: Apr. 21, 2008

(51) Int. Cl.
*G06F 17/50* (2006.01)

(52) U.S. Cl. ........................................ 716/118; 709/226

(58) Field of Classification Search .................. 716/118; 709/226
See application file for complete search history.

(56) References Cited

U.S. PATENT DOCUMENTS

| | | | |
|---|---|---|---|
| 5,914,616 A | 6/1999 | Young et al. | |
| 6,064,819 A * | 5/2000 | Franssen et al. | 717/156 |
| 6,466,049 B1 | 10/2002 | Diba et al. | |
| 6,986,109 B2 * | 1/2006 | Allen et al. | 716/2 |
| 7,299,439 B1 * | 11/2007 | Slonim et al. | 716/10 |
| 7,451,422 B1 * | 11/2008 | Slonim et al. | 716/16 |
| 7,464,147 B1 * | 12/2008 | Fakhouri et al. | 709/223 |
| 7,480,884 B1 * | 1/2009 | Slonim et al. | 716/10 |
| 7,653,884 B2 * | 1/2010 | Furnish et al. | 716/2 |
| 2004/0230922 A1 * | 11/2004 | Allen et al. | 716/2 |
| 2009/0031259 A1 * | 1/2009 | Gray et al. | 716/2 |
| 2009/0228844 A1 * | 9/2009 | Mak et al. | 716/2 |

OTHER PUBLICATIONS

Mak et al.; "On Constrained Pin-Mapping for FPGA—PCB Codesign"; IEEE; vol. 25, No. 11; Nov. 2006; pp. 2393-2400.*
Koushanfar et al.; "ILP-Based Engineering Change"; DAC2002, Jun. 10-14, 2002, New Orleans, Louisiana, USA.; pp. 910-915.*
Xilinx, Inc., "The Programmable Logic Data Book 2000," published Apr. 2000, pp. 3-75 to 3-96, available from Xilinx, Inc., 2100 Logic Drive, San Jose, CA 95124, USA.
Xilinx, Inc., "Virtex-II Platform FPGA Handbook," published Dec. 2000, pp. 33-75, available from Xilinx, Inc., 2100 Logic Drive, San Jose, CA 95124, USA.
Xilinx, Inc., "Virtex-II Pro Platform FPGA Handbook," published Oct. 14, 2002, pp. 19-71, available from Xilinx, Inc., 2100 Logic Drive, San Jose, CA 95124, USA.

* cited by examiner

*Primary Examiner* — Naum Levin
(74) *Attorney, Agent, or Firm* — Pablo Meles; Kevin T. Cuenot

(57) ABSTRACT

A method of input/output (I/O) block placement assigned to an input/output bank includes formulating a placement algorithm using integer linear programming (ILP) and simultaneously placing single groups and Relatively Placed Module (RPM) groups of I/O blocks in the I/O bank. The method further includes determining a placeability matrix P and a binary assignment matrix X used for the ILP. The method can further eliminate all assignment matrix elements of X equal to 0 in the integer linear programming and re-index any remaining elements. The method can further place all I/O blocks according to a solution if solving of the standard ILP formulation results in a feasible solution. Optionally, the method generates a placement solution that is as close as possible to an external reference solution specified by designer. Optionally, the method analyzes which constraints were violated and generates useful error information.

20 Claims, 4 Drawing Sheets

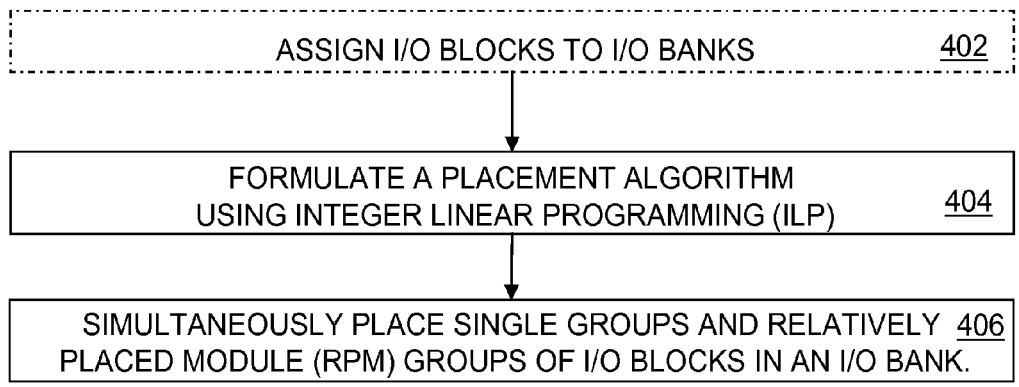

PLACEMENT OF I/O BLOCKS WITHIN I/O BANKS USING AN INTEGER LINEAR PROGRAMMING FORMULATION

FIELD OF THE INVENTION

The invention relates to the field of circuit design and, more particularly, to the use of Integer Linear Programming for placing the input/output (IO) components for a given design.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

All PLDs including FPGAs, provide special programmable circuits that can be used as external inputs or outputs for a circuit design implemented on the device. These are collectively referred to as I/O Sites (or I/O pins). The I/O blocks in a circuit design are assigned to the I/O sites in the PLD in a process that is collectively referred to as I/O Placement. The I/O sites allow the design implemented on the PLD to electrically connect with external devices and systems. Each I/O site and I/O block has a set of electrical parameters defined for it. This includes parameters like drive voltages $V_{cci}$ and $V_{cco}$, reference voltage $V_{ref}$, termination voltage $V_r$, drive strength, digitally controlled impedance (DCI) and termination. An allowed combination of these parameters is referred to as an I/O Standard. Each I/O site and I/O block is thus associated with an I/O standard. Examples for I/O standards can include LVCMOS33, LVCMOS25, LVTTL and LVDS25. I/O standards that require incompatible values for their electrical parameters are said to be incompatible with each other and vice versa.

Most modern PLDs organize I/O sites on the device into a limited number of physical I/O Banks (banks) on the PLD. A PLD, such as an FPGA, can include 8 banks, although this number is not definitive of every type of PLD as different PLDs can include different numbers of banks. The I/O sites in any given bank can share some or all of their electrical circuitry. Most commonly, the I/O sites in a bank share the $V_{cco}$, $V_{cci}$, $V_{ref}$ and $V_r$ voltage supplies. Note that this sharing and other such conditions, introduces compatibility constraints for the I/O blocks that can be assigned to a bank and placement constraints for the assignment of individual I/O blocks to I/O sites within the bank.

The I/O blocks that are assigned to a given bank should be configured according to compatible I/O standards. For example, the I/O standard LVTTL requires a $V_{cco}$ value of 3.3 volts, while the I/O standard LVDCI_18 requires 1.8 volts. Since the $V_{cco}$ values do not match, a circuit cannot implement I/Os of these two I/O standards in the same I/O bank.

A second condition that arises in I/O banks is due to the dual purpose nature of some I/O sites in the bank. To conserve silicon area, some I/O sites on the bank can be used for both reference voltages ($V_{ref}$, $Vr$) or for regular I/O blocks. If any I/O block that requires a reference voltage is assigned to a bank then some or all of the $V_{ref}/V_r$ sites in that bank should be used for the required voltage. These sites are then unavailable for other regular I/O blocks. For example, the I/O standard SSTL2_I requires a reference voltage $V_{ref}$ of 1.25 volts. If an I/O block of this standard is placed in a bank, then all $V_{ref}$ sites in that bank are reserved for the reference voltage and no other I/O block of any I/O standard can be placed on the $V_{ref}$ sites in that bank. Conversely, if no I/O block that requires a reference voltage is assigned to a bank, then all $V_{ref}$ sites in that bank are usable for regular I/O blocks.

A third condition that arises in I/O banks is due to the placement constraint of Relationally Placed Macros (RPMs) in the circuit design. An I/O RPM is made up of 2 or more I/O blocks that have to be placed in a predefined relative form. A common example of I/O RPMs is differential I/O (LVDS) pairs. These consist of two I/O blocks, namely a master and a slave, that are generally required to be placed together, adjacent to each other, in a predefined orientation. Note that a typical circuit design implemented in PLDs may have a mix of both RPM I/Os and single (non-RPM) I/O blocks. Consider an I/O bank with 10 I/O sites. An assignment of 8 single I/O blocks and 1 I/O RPM of two I/O blocks (all with compatible I/O standards) to this bank is perfectly legal from an assignment point of view and is illustrated below:

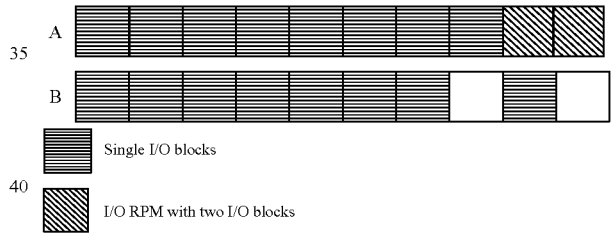

If the single I/O blocks are placed such that two adjacent I/O sites are available (A), then the I/O RPM has a legal placement available. However, if the single I/O blocks are placed such that no two adjacent sites are available (B), then the I/O RPM cannot be placed anywhere in the bank.

A fourth condition that arises in I/O banks is due to the fact that a given I/O bank may consist of I/O sites of different types. A given I/O block in a design may be placed on only a subset of the I/O sites in a bank. For example, an I/O bank with 20 sites in total may have 10 Clock-IO sites that are capable of driving global clock buffers in the FPGA device. An assignment of 10 Clock-IO blocks and 10 non-Clock-IO blocks from a design to this bank is perfectly legal from an assignment point of view. However, if all 10 of the non-Clock-IO blocks are placed onto the 10 Clock-IO sites in the bank, then the Clock-IO blocks cannot be assigned to any sites in the bank.

A fifth condition that arises in I/O banks is due to user imposed placement constraints on I/O blocks. For various reasons, the user might restrict the placement of an I/O block to a subset of the I/O sites in a bank. These placement constraints are collectively referred to as Range Constraints.

Note that range constraints may also be imposed by the tools themselves, without any user input. For example, consider an I/O bank with 10 I/O sites. Six I/O blocks (with compatible I/O standards) are assigned to this bank. One of the I/O blocks has been range constrained to the left half of the I/O bank, meaning that it has to be placed on any of the 5 I/O sites on the left-hand-side of the bank. In C shown below, the 5 I/O blocks that are not range-constrained have been placed on the 5 I/O sites on the right-hand-side of the bank. Hence the one range-constrained block can be placed on any of the free I/O sites on the left-hand-side. However if the 5 unconstrained I/O blocks are placed on the left-hand-side of the bank (D), then the range-constrained I/O block cannot be placed on any I/O site in the bank leading to an I/O placement failure.

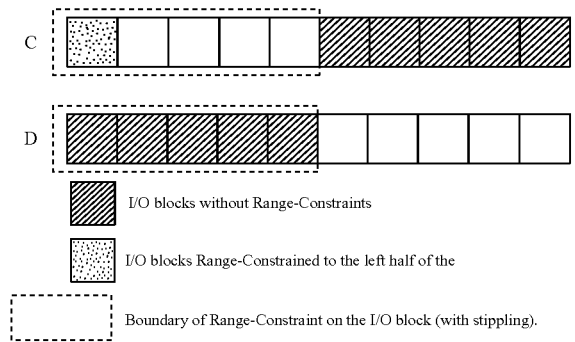

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

FIG. 1 is a block diagram of an exemplary FPGA. As noted above, advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 2 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

FIG. 2 is a simplified diagram of a well known Complex Programmable Logic Device (CPLD) architecture. FIG. 2 is a simplified illustration of an exemplary CPLD. A CPLD typically includes two or more logic blocks (LBs 201a-201h) connected together and to input/output blocks (I/Os 202a-202f) by a programmable interconnection array (203). Each logic block of the CPLD includes a two-level AND/OR structure similar to those used in Programmable Logic Arrays (PLAs) and Programmable Array Logic (PAL) devices. The interconnection array includes many multiplexer circuits 205, each including several PIPs 204. In each multiplexer circuit 205, only one PIP 204 is enabled. The enabled PIP selects one of the many input signals provided to the interconnection array, and the selected input signal is provided as the output signal from the multiplexer circuit 205.

In CPLDs, configuration data is typically stored on-chip in non-volatile memory. In some CPLDs, configuration data is stored on-chip in non-volatile memory, then downloaded to volatile memory as part of an initial configuration sequence.

Further information on CPLDs can be found, for example, in U.S. Pat. No. 6,466,049 B1 by Sholeh Diba et al., issued Oct. 15, 2002, which is hereby incorporated herein by reference.

One such FPGA, the Xilinx Virtex® FPGA, is described in detail in pages 3-75 through 3-96 of the Xilinx 2000 Data Book entitled "The Programmable Logic Data Book 2000" (hereinafter referred to as "the Xilinx Data Book"), published April, 2000, available from Xilinx, Inc., 2100 Logic Drive, San Jose, Calif. 95124, which pages are incorporated herein by reference. (Xilinx, Inc., owner of the copyright, has no objection to copying these and other pages referenced herein but otherwise reserves all copyright rights whatsoever.) Young et al. further describe the interconnect structure of the Virtex FPGA in U.S. Pat. No. 5,914,616, issued Jun. 22, 1999 and entitled "FPGA Repeatable Interconnect Structure with Hierarchical Interconnect Lines", which is incorporated herein by reference in its entirety.

One such FPGA, the Xilinx Virtex®-II FPGA, is described in detail in pages 33-75 of the "Virtex-II Platform FPGA Handbook", published December, 2000, available from Xilinx, Inc., 2100 Logic Drive, San Jose, Calif. 95124, which pages are incorporated herein by reference.

Another such FPGA, the Xilinx Virtex-II Pro™ FPGA, is described in detail in pages 19-71 of the "Virtex-II Pro Platform FPGA Handbook", published Oct. 14, 2002 and available from Xilinx, Inc., 2100 Logic Drive, San Jose, Calif. 95124, which pages are incorporated herein by reference.

As FPGA designs increase in complexity, they reach a point at which the designer cannot deal with the entire design at the gate level. Where once a typical FPGA design comprised perhaps 5,000 gates, FPGA designs with over 100,000 gates are now common. To deal with this complexity, circuits are typically partitioned into smaller circuits that are more easily handled. Often, these smaller circuits are divided into yet smaller circuits, imposing on the design a multi-level hierarchy of logical blocks.

Libraries of pre-developed blocks of logic have been developed that can be included in an FPGA design. Such library modules include, for example, adders, multipliers, filters, and other arithmetic and DSP functions from which complex designs can be readily constructed. The use of pre-developed logic blocks permits faster design cycles, by eliminating the redesign of duplicated circuits. Further, such blocks are typically well tested, thereby making it easier to develop a reliable complex design.

All modern FPGAs use a banked I/O organization with a specified number of I/O banks of certain capacities, and set of restrictions (banking rules) that specify which I/O blocks can be combined in the same I/O bank. Thus the placement of I/O blocks is subject to a set of constraints imposed by the bank organization (and available resources), and various compatibility rules. Such problems belong to the class of "constrained optimization problems".

Modern approaches to such constrained optimization problems often use a "separation principle" that splits the complete problem into 2 separate tasks. The first task involves a pure assignment problem and a second task involves a sequential placement problem. The assignment task does not attempt to place all I/O blocks into available sites physically, but merely assigns all movable unlocked I/O blocks to the I/O banks in a way that satisfies all relevant constraints. The main purpose of the "assignment problem" is to prove the feasibility of a design and in the case of a feasible design to provide one or more feasible assignment solutions. The set of feasible solutions can optionally be improved at a later stage to optimize for other cost functions like wire-length, timing constraints or other constraints.

The second task includes the physical placement of I/O blocks assigned to an I/O bank to I/O sites available within a given bank. Existence of a feasible solution for the assignment task guarantees that only compatible I/O blocks are assigned to a bank and that the bank's capacity is sufficient to accommodate all assigned I/O blocks. Nonetheless, physical placement within I/O banks is still a non-trivial problem because some sites may not be available for usage by some I/O blocks. It is also much more complicated when the set of assigned I/O blocks are part of Relatively Placed Modules (RPMs). An RPM is a set of blocks with predefined relative coordinates.

Traditional methods of intra-bank placement can be broadly classified as one of two types. A first type can use heuristics that tries direct sequential placement of an ordered set of I/O blocks to an ordered set of I/O sites. In all cases ordering of I/O blocks should be predefined and constitutes a part of placement algorithm. For simple cases, the heuristic approach is frequently sufficient. Its main drawback is the very strong dependency on the ordering. In a difficult situation, it frequently assigns some I/O blocks to the first available and compatible sites, while leaving some other I/O blocks without sufficient and suitable I/O sites. It is also extremely difficult to use in situations when there are non-uniform sets of I/O blocks (e.g., clock IOs and regular Select IOs) that have different compatibility to available sites.

A second type of intra-bank placement can use a more generic bi-partite matching that tries to find best placement of the set of I/O blocks to the set of I/O sites using some static cost functions. This method is much better for many situations, but it has a lot of inconsistencies when applied to a mix of single IOs and IOs that are part of RPMs. As a result, for such situations, the method convergence is bad and results are not reliable. Also note, it is a common feature of all heuristic approaches that they cannot prove the existence of a feasible placement solution or the lack of it.

SUMMARY OF THE INVENTION

A generic approach for intra-bank placement or a method for placement of I/O blocks assigned to an I/O bank that is based on Integer Linear Programming (ILP) formulation is presented. This approach can automatically determine if a given problem instance is feasible or not. This approach treats both single IOs and IOs that are part of an RPM in a similar way and allows to use powerful and very efficient numerical methods developed for ILP solvers. The algorithm allows for quick and unambiguous detection of placement solution feasibility. The method can be very fast and efficient. The method can avoid ordering dependencies and allows for simultaneous placement of single and RPM groups of I/O blocks. The ILP formulation is described in more detail below and includes description of ILP variables, set of constraints and an optional objective function.

In an embodiment herein, a method of input/output (I/O) block placement assigned to an input/output bank can include the steps of formulating a placement algorithm using integer linear programming and simultaneously placing single groups and Relatively Placed Module (RPM) groups of I/O blocks in the I/O bank. The method lacks ordering dependencies and the method can assume that assignment of I/O blocks to I/O banks has already occurred. The method can further include the step of determining a placeability matrix P and a binary assignment matrix X used for the integer linear programming. The method can further eliminate all elements of X equal to 0 in the integer linear program formulation and re-index any remaining elements. The method can further include various steps as performed by the system as described below and in the remainder of the specification and embodiments within contemplation of the claimed embodiments are not necessarily limited to each step presented or the order in which such steps are presented.

In another embodiment herein, a system for analytical placement of input/output (I/O) blocks assigned to input/output banks can include a presentation device and a processor coupled to the presentation device. The processor can be programmed to formulate a placement algorithm using integer linear programming and simultaneously place single groups and Relatively Placed Module (RPM) groups of I/O blocks in an I/O bank. As noted above, the system can enable the automatic placement of I/O blocks to I/O sites using a binary placeability matrix. The system can assume that assignment of I/O blocks to the I/O banks has already occurred. The processor can be further programmed to determine a placeability matrix P and a binary assignment matrix X used for the integer linear programming. The processor can also be programmed to eliminate all elements of X equal to 0 in the integer linear programming and re-index any remaining elements. The system can further include one or more processors that perform the various steps described with respect to the methods above and in the remainder of the specification and embodiments within contemplation of the claimed embodiments are once again not necessarily limited to each step presented or the order in which such steps are presented.

BRIEF DESCRIPTION OF THE DRAWINGS

FIG. 4 illustrates another flow chart illuminating a method in accordance with an embodiment of the present invention.

DETAILED DESCRIPTION

Embodiments of the present invention are applicable to a variety of integrated circuits (ICs). Some embodiments have been found to be particularly applicable to and beneficial for programmable logic devices (PLDs). Explanations and descriptions of various embodiments of the present invention are illuminated by way of specific examples utilizing PLDs such as field programmable gate arrays (FPGAs). However, the present invention is not limited by these examples, and can be applied to virtually any IC that includes programmable resources.

Figure 1:
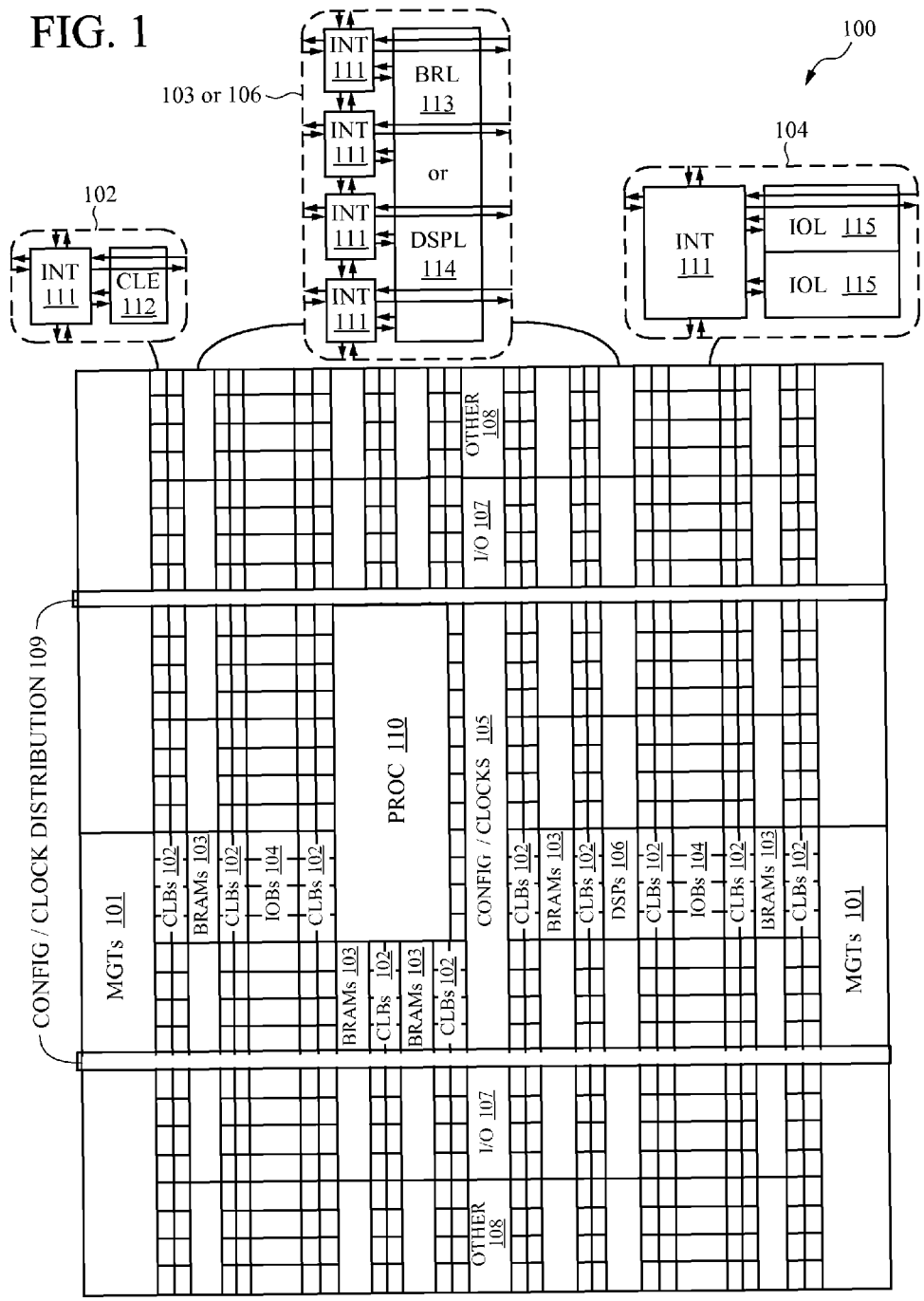
FIG. 1 illustrates a block diagram of an exemplary FPGA.
Figure 2:
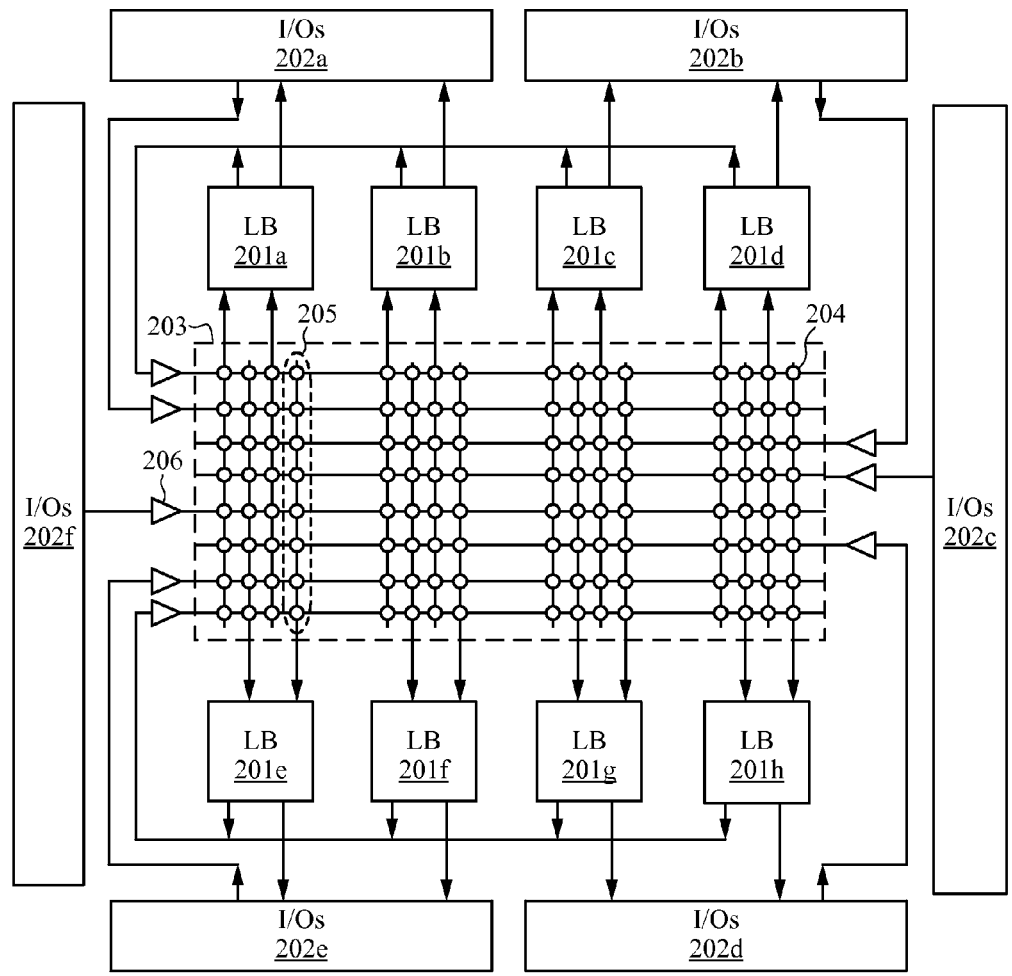
FIG. 2 illustrates a block diagram of a well known Complex Programmable Logic Device (CPLD) architecture.
Figure 3:
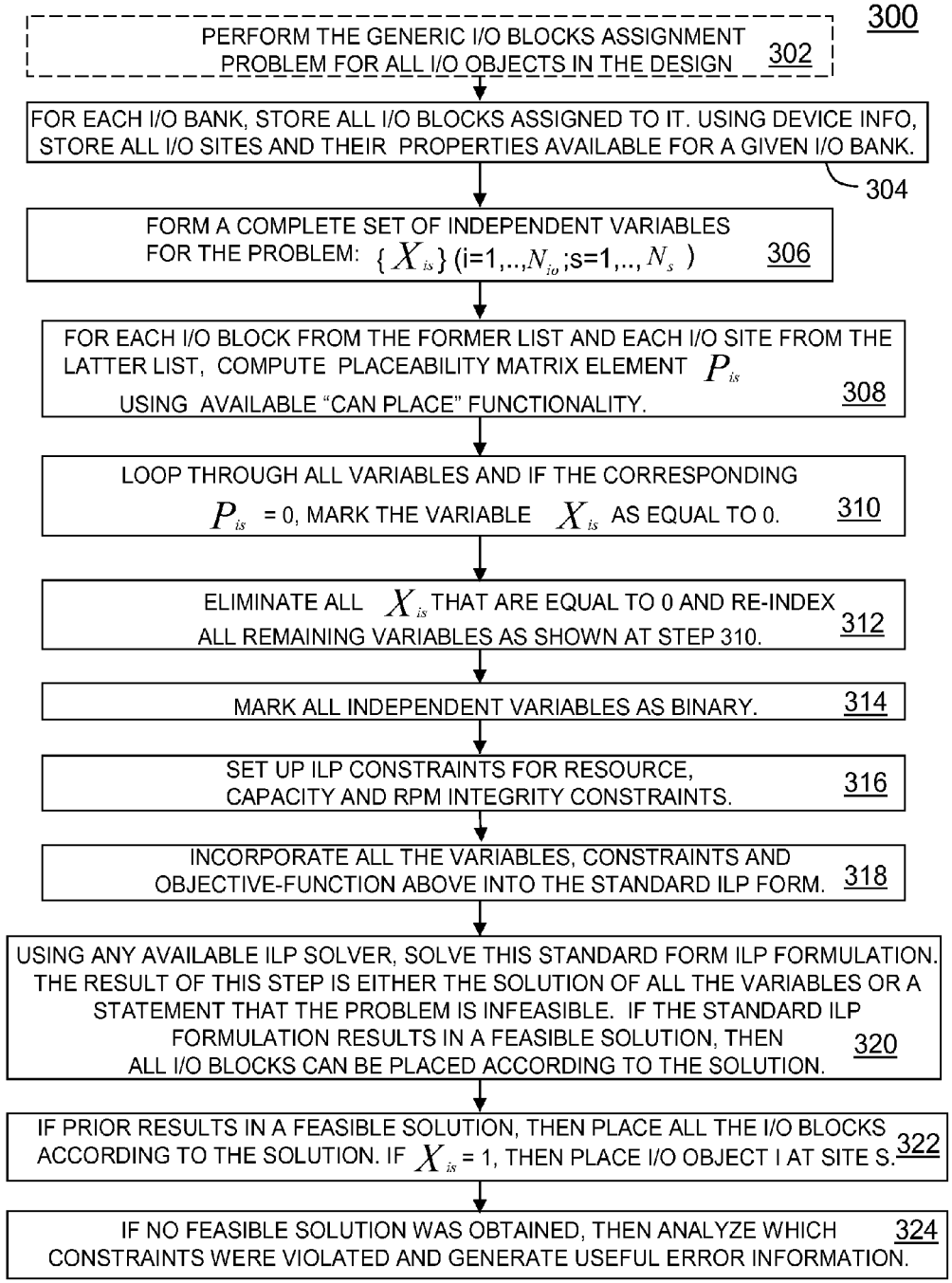
FIG. 3 illustrates a flow chart illuminating a method in accordance with an embodiment of the present invention.

Referring to FIGS. 3 and 4, flow charts illustrating methods 300 and 400 respectively of input/output (I/O) block placement assigned to an input/output bank are shown. As noted above and from a broader perspective, the generic Select IO placement problem can be divided into 2 separated tasks, namely, the assignment of all I/O blocks to available I/O banks (shown as optional step 402) and the sequential placement that creates a mapping between blocks and available sites in the bank. The method 400 can generally include the step 404 of formulating a placement algorithm using integer linear programming and the step 406 of simultaneously placing single blocks or groups and RPM groups of I/O blocks in an I/O bank. Note that the steps in FIGS. 3 and 4 are merely illustrative and should not necessarily imply a particular order or a particular sequence.

Embodiments herein generally provide a solution for the second task only. Most embodiments can assume that the first task was already performed and I/O assignment to I/O banks is known. Because this solution is known to be legal, a set of I/O blocks will be known as compatible to each other and a total number N of such blocks will not be larger than bank capacity. One should note that placement still could be impossible because some sites can be incompatible with some I/O blocks or IOs that are part of an RPM that cannot be placed together.

Traditionally intra-bank placement methods use either some direct sequential assignment heuristics or bi-partite matching. All such approaches cannot prove feasibility of placement. The latter approach has a lot of inconsistencies whenever placement includes a mixed set of single I/O blocks and RPMs (Relative Placement Modules) with I/O blocks.

Further description of the ILP formulation and terminology is provided herein. Each I/O Bank on an FPGA device can be characterized by I/O sites available for placement of I/O blocks. Generally, an IO object can or cannot be placed onto an IO site. This relationship is known as "placeability" of an I/O object to I/O site. There are multiple reasons for unplaceability, including, IO site and IO object that can have different types, or a site that can have a special property such as a dedicated Vref or Vr site and such site should stay empty during the placement. Generically, binary placeability matrix P as well as binary assignment matrix X can be defined with dimensions $N_{io} \cdot N_s$, where $N_{io}$ is the total number of I/O blocks assigned to a bank and $N_s$ is the total number of IO sites in a bank. As defined: $P_{is}=1$, if a single I/O block i can be placed (assigned) to an I/O site s, or $P_{is}=0$ otherwise. Also, $N_{io}<=N_s$ is a requirement for a feasible solution to exist. The placeability matrix can be computed once and for all when assignment of I/O blocks to a bank is known.

All I/O blocks assigned to a bank can be part of simple I/O group that consists of a single I/O object or part of a so called RPM (relative placement module) that consists of Nrpm I/O blocks (where Nrpm>1). An important part of the RPM definition is that all relative positions of IO blocks inside of an RPM should be honored by placement. The relative position of each I/O object j inside of RPM can be defined as Rj={Rxj, Ryj}. These relative positions are important when matrix elements $P_{is}$ of placeability matrix are computed. Even if an I/O site is compatible with a single I/O object ($P_{is}=1$), it may become incompatible ($P_{is}=0$) if relative sites cannot support other I/O Blocks from RPM.

Further description of the ILP variables can clarify the embodiments herein. Binary variables $X_{is}$ (i=1, ..., $N_{io}$; s=1, ... $N_s$) are called IO Assignment Variables. They describe whether I/O site s is used for placement of I/O object i. It is worth mentioning that even though a maximum number of such variables $N_{io} \cdot N_s$ appears very large, in reality all variables where $P_{is}=0$ can be eliminated and ILP complexity can be reduced. These variables also form sets of variables where only 1 variable of a set can be 1 and all other are 0. These sets are called "Special Ordered Sets of type I" (SOS1) and greatly reduce ILP model complexity.

With respect to resource constraints, each I/O Object can be assigned to any I/O site. To reflect the fact that an I/O object will be assigned physically to one I/O site only, the following set of equations for variables $X_{is}$ should be satisfied $$\forall_i \sum_{s=1}^{N_s} X_{is} = 1 \; (i = 1, \ldots, N_{io}) \tag{1}$$

Total number of Resource constraints is equal $N_{io}$, one for each I/O block assigned to the bank. The equality (1) also indicates that set of $\{X_{is}\}$ (s=1, ..., $N_s$) is the Special Ordered Set of type 1 (SOS1). There are $N_{io}$ such sets. That fact makes the ILP solution in this context much faster and efficient than would normally be contemplated otherwise.

With respect to capacity constraints, each I/O site can support not more than one I/O object. In mathematical form:

$$\forall_s \sum_{i=1}^{N_{io}} X_{is} \leq 1 \; (s = 1, \ldots, N_s) \tag{2}$$

The total number of Capacity constraints is equal Ns. Again, variables Xis form a set $\{X_{is}\}$ (i=1, ..., $N_{io}$) that is another SOS1.

With respect to placeability constraints, each I/O object can be assigned to I/O site if and only if the corresponding placeability matrix element $P_{is}$ equal to 1. This constraint allows to reduce drastically a total number of independent ILP variables. In mathematical form:

$$\forall_i \forall_s X_{is} \leq P_{is} \; (i=1, \ldots, N_{io}; s=1, \ldots, N_s) \tag{3}$$

From (3) above, one can see that if $P_{is}=0$, then $X_{is}=0$. If $P_{is}=1$, then $X_{is}$ can be 0 or 1. When all $X_{is}$ that have $P_{is}=0$ are identified, those elements can be eliminated from the ILP formulation and all other elements can be re-indexed. This re-indexing can be performed by converting 2 dimensional matrix X into one dimensional vector. Note that this elimination and re-indexing can be performed on as needed basis when problem complexity is large.

With respect to RPM integrity constraints, each I/O Object j that is part of RPM has known relative coordinates Rxj and Ryj. From RPM definition one can see that only one I/O block from RPM group is truly independent. If $X_{is}$ is an independent ILP variable, all other $X_{jt}$ variables for I/O blocks j that are part of RPM are dependent variables. In particular, the relation can be defined as:

$$X_{is}=X_{jt} \tag{4}$$

The relationship (4) is valid if both I/O blocks i and j are part of the same RPM and absolute 2-dimensional coordinates (grid coordinates) that describe sites s and t satisfy these relations:

$$Axt=Axs+(Rxj-Rxi) \tag{5}$$

$$Ayt=Ays+(Ryj-Ryi) \tag{6}$$

For all other sites t that are not described by (5) and (6), $X_{jt}$ are strictly 0 and can be eliminated from ILP formulation. Thus, total number of RPM Integrity constraints is device and design dependent and should be computed for each placement instance, but only once.

With respect to integrality constraints, all $X_{is}$ are binary variables. As was mentioned above they are also parts of overlapping SOS1 sets that considerably simplifies the solution. If any solution for $\{X_{is}\}$ (i=1, ..., $N_{io}$; s=1, ..., $N_s$) is found and all constraints listed above are satisfied, the placement is feasible and the actual placement solution can be obtained. If such solution does not exist, an ILP solver reports that such model is infeasible.

Optionally, for intra-bank placement an ILP objective function is not necessary and is optional. It can still be a useful addition to formulation if one wants not only a feasible placement solution but also a solution as close as possible to a fixed and known external (reference) solution. This assumes that a reference solution can be given in terms of 2-dimensional absolute coordinates for each I/O block. Such reference point can be denoted as {Zxi, Zyi}. The following objective function that is linear in terms of $X_{is}$ and allows minimize distances for all placed I/O blocks to fixed reference points is introduced below:

$$F = \sum_{i=1}^{Nio} \sum_{s=1}^{Ns} XisDis \tag{7}$$

where Dis is the distance between fixed reference point for I/O block i and I/O site s where I/O block i is being assigned:

$$Dis=sqrt((Axs-Zxi)^{}2+(Ays-Zyi)^{}2) \tag{8}$$

Because only one Xis can be equal to 1 for some site s, objective function will be minimized when placement is as close as possible to reference solution. It is worth to note that the feasibility of the problem is preserved.

ILP parameters and formulation are now described in further detail. To complete a generic ILP formulation we need to describe how to compute $P_{is}$ in more details. We can compute matrix elements $P_{is}$ for each I/O site using available device information. In particular we can compute $P_{is}$ by checking the following rules:

1. Is this site not prohibited by any user imposed constraints?
2. Do this site and I/O object have compatible types?
3. Does this site have enough neighboring sites to accommodate all I/O blocks (and possibly different types of blocks) from RPM group?
4. Is this site not a dedicated site (E.g. special Vref or Vr sites) when one or more assigned I/O blocks require such site to be empty?
5. Does this site belong to the range-constrained area imposed on I/O object?

If all these rules are satisfied one can conclude that $P_{is}=1$. Otherwise it cannot be used to place I/O block and $P_{is}=0$.

With respect to the ILP algorithm and with further reference to FIG. 3 again, the formulation with detailed listing of steps involved for software implementation of the presented algorithm can be completed, namely by the following exemplary steps:

At step 302, the method 300 can perform the generic I/O blocks assignment problem for all I/O objects in the design.

At step 304, for each I/O bank, the method can store all I/O blocks that got assigned to it. Using device information, the method can also store all I/O sites and their properties available for a given I/O bank.

At step 306, the method can form a complete set of independent variables for the problem:

$$\{X_{is}\} (i=1,\ldots,N_{io}; s=1,\ldots,N_s)$$

For each I/O block from the former list and each I/O site from the latter list, the method can compute placeability matrix element $P_{is}$ as shown at step 308, using available "can place" functionality.

At step 310, the method can loop through all variables and if the corresponding $P_{is}=0$, then the method can mark the variable $X_{is}$ as equal to 0.

At step 312, the method can eliminate all $X_{is}$ that are equal to 0 and re-index all remaining variables.

At step 314, the method can mark all independent variables as binary.

At step 316, the method can set up ILP constraints for resource, capacity and RPM integrity constraints.

At step 318. the, method can incorporate all the variables, constraints and objective-function above into the standard ILP form.

Using any available ILP solver, the method can solve this standard form ILP formulation at step 320. The result of this step is either the solution of all the variables or a statement that the problem is infeasible. If the standard ILP formulation results in a feasible solution, then all I/O blocks can be placed according to the solution.

At step 322, if the prior step 320 results in a feasible solution, then the method can place all the I/O blocks according to the solution. If $X_{is}=1$, then the method can place I/O object i at site s.

If no feasible solution was obtained in Step 320, then the method at step 324 can analyze which constraints were violated and generate useful error information. Note, the placeability matrix element $P_{is}$ for each I/O site is computed as 1 if all of a set of conditions are satisfied and otherwise the placeability matrix element $P_{is}$ is computed as 0 (if any condition among the set of conditions is not satisfied.

In summary, a novel methodology for the automatic placement of I/O blocks to I/O sites has been presented. This placement represents a second part of the general IO placement problem and the formulation uses an ILP approach. The ILP approach is based on a novel concept of a Binary Placeability Matrix. This formulation allows for quick determination of placement feasibility and efficient generation of the solution if any feasible solution exists. This formulation does not suffer from the usual ordering dependencies and is efficient in terms of a minimal number of variables and constraints. All I/O blocks, whether they are single IOs or part of RPMs, are treated uniformly. The method also allows additional proximity optimization in terms of closeness of ILP based solution to an external reference solution.

What is claimed is:

1. A method of input/output (I/O) block placement assigned to an input/output bank, comprising the steps of:
    formulating a placement algorithm using integer linear programming; and
    simultaneously placing, via a processor, single groups and Relatively Placed Module (RPM) groups of I/O blocks in the I/O bank, wherein each RPM group comprises a plurality of I/O blocks with each I/O block of the RPM group having a defined position relative to each other I/O block of the RPM group.

2. The method of claim 1, wherein the method is implemented independently of ordering dependencies.

3. The method of claim 1, wherein the method assumes that assignment of I/O blocks to the I/O banks has already occurred.

4. The method of claim 3, wherein the integer linear programming comprises:
    storing all I/O blocks that got assigned to each I/O bank for each I/O bank and storing all I/O sites and their properties available for a given I/O bank using device information;
    forming a complete set of independent variables: $\{X_{is}\}$ $(i=1,\ldots,N_{io}; s=1,\ldots,N_s)$;
    for each I/O block from a former list and each I/O site from a latter list, computing placeability matrix element $P_{is}$, using available placer functionality;
    looping through all variables and if the corresponding $P_{is}$ equal to zero, marking the variable $X_{is}$ as equal to zero;
    eliminating all $X_{is}$ that are equal to zero and re-index all remaining variables;
    marking all independent variables as binary;
    setting up ILP constraints for resource, capacity and RPM integrity constraints;
    incorporating all variables, constraints and objective-functions into a standard ILP form; and
    using any available ILP solver, solving the standard ILP form, wherein the result is either a solution of all the variables or a statement that a problem is infeasible.

5. The method of claim 4, wherein the method further comprises the step of placing all the I/O blocks according to the solution if the solving of the standard ILP form results in a feasible solution, wherein if $X_{is}$ is equal to 1, then placing I/O object i at site s.

6. The method of claim 4, wherein the method further comprises the step analyzing which constraints were violated and generating useful error information if no feasible solution was obtained when solving the standard ILP form.

7. The method of claim 1, wherein the method further comprises the step of determining a placeability matrix P and a binary assignment matrix X used for the integer linear programming.

8. The method of claim 7, wherein the method further comprises the step of eliminating all assignment matrix elements of X equal to zero in the integer linear programming and re-indexing any remaining elements.

9. The method of claim 7, wherein the placeability matrix P has placeability matrix elements $P_{is}$ for each I/O site that is computed as 1 if all of a set of conditions are satisfied:
   the I/O site is not prohibited by a user constraint;
   the I/O site and an I/O object are of compatible types;
   the I/O site has enough neighboring sites to accommodate all I/O blocks from an RPM group;
   the I/O site is not dedicated for another purpose when one or more assigned I/O blocks require such site to be empty; and
   the I/O site belongs to a range-constrained area imposed on an I/O object.

10. The method of claim 9, wherein the placeability matrix elements $P_{is}$ for each I/O site is computed as zero if any condition among the set of conditions is not satisfied.

11. A system for analytical placement of input/output (I/O) blocks assigned to input/output banks, comprising:
   a presentation device; and
   a processor coupled to the presentation device, programmed to:
      formulate a placement algorithm using integer linear programming; and
      simultaneously place single groups and Relatively Placed Module (RPM) groups of I/O blocks in an I/O bank, wherein each RPM group comprises a plurality of I/O blocks with each I/O block of the RPM group having a defined position relative to each other I/O block of the RPM group.

12. The system of claim 11, wherein the system enables automatic placement of I/O blocks to I/O sites using a binary placeability matrix.

13. The system of claim 11, wherein the system assumes that assignment of I/O blocks to the I/O banks has already occurred.

14. The system of claim 11, wherein the processor is further programmed to determine a placeability matrix P and a binary assignment matrix X used for the integer linear programming.

15. The system of claim 14, wherein the processor is further programmed to eliminate all assignment matrix elements of X equal to zero in the integer linear programming and re-index any remaining elements.

16. The system of claim 14, wherein the placeability matrix P has placeability matrix elements $P_{is}$ for each I/O site is computed as 1 if all of a set of conditions are satisfied:
   the I/O site is not prohibited by a user constraint;
   the I/O site and an I/O object are of compatible types;
   the I/O site has enough neighboring sites to accommodate all I/O blocks from an RPM group;
   the I/O site is not dedicated for another purpose when one or more assigned I/O blocks require such site to be empty; and
   the I/O site belongs to a range-constrained area imposed on an I/O object.

17. The system of claim 16, wherein the placeability matrix elements $P_{is}$ for each I/O site is computed as zero if any condition among the set of conditions is not satisfied.

18. A non-transitory machine readable storage medium, having stored thereon a computer program having a plurality of code sections executable by a machine for causing the machine to perform the steps of:
   formulating a placement algorithm using integer linear programming; and
   simultaneously placing single groups and Relatively Placed Module (RPM) groups of I/O blocks in an I/O bank, wherein assignment of I/O blocks to the I/O banks is assumed, and wherein each RPM group comprises a plurality of I/O blocks with each I/O block of the RPM group having a defined position relative to each other I/O block of the RPM group.

19. The machine readable storage medium of claim 18, wherein the computer program further has a plurality of code sections executable by the machine for causing the machine to perform the steps of:
   determining a placeability matrix P and a binary assignment matrix X used for the integer linear programming, wherein the placeability matrix elements Pis for each I/O site is computed as 1 if all of a set of conditions as follows are satisfied:
   the I/O site is not prohibited by a user constraint;
   the I/O site and an I/O object are of compatible types;
   the I/O site has enough neighboring sites to accommodate all I/O blocks from an RPM group;
   the I/O site is not dedicated for another purpose when one or more assigned I/O blocks require such site to be empty; and
   the I/O site belongs to a range-constrained area imposed on an I/O object.

20. The machine readable storage medium of claim 18, wherein the integer linear programming comprises:
   storing all I/O blocks that got assigned to each I/O bank for each I/O bank and storing all I/O sites and their properties available for a given I/O bank using device information;
   forming a complete set of independent variables: $\{X_{is}\}$ (i=1, . . . , $N_{io}$; s=1, . . . , $N_s$);
   for each I/O block from a former list and each I/O site from a latter list, computing placeability matrix element $P_{is}$, using available placer functionality;
   looping through all variables and if the corresponding $P_{is}$ equal to zero, marking the variable $X_{is}$ as equal to zero;
   eliminating all $X_{is}$ that are equal to zero and re-index all remaining variables;

marking all independent variables as binary;
setting up ILP constraints for resource, capacity and RPM integrity constraints;
incorporating all variables, constraints and objective-functions into a standard ILP form; and
using any available ILP solver, solving the standard ILP form, wherein the result is either a solution of all the variables or a statement that a problem is infeasible.

* * * * *